(12) United States Patent
Lin

(10) Patent No.: US 9,420,714 B2
(45) Date of Patent: Aug. 16, 2016

(54) ELECTRONIC DEVICE WITH UNIFIED DISPLAY MOUNTING STRUCTURES

(71) Applicant: Apple Inc., Cupertino, CA (US)

(72) Inventor: Wey-Jiun Lin, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 472 days.

(21) Appl. No.: 13/716,700

(22) Filed: Dec. 17, 2012

(65) Prior Publication Data

US 2014/0168864 A1 Jun. 19, 2014

(51) Int. Cl.
| | |
|---|---|
| *G06F 1/16* | (2006.01) |
| *H05K 7/00* | (2006.01) |
| *G02F 1/1333* | (2006.01) |
| *G02F 1/1335* | (2006.01) |

(52) U.S. Cl.
CPC ............ *H05K 7/00* (2013.01); *G02F 1/133308* (2013.01); *G02F 1/133615* (2013.01); *G02F 2001/133314* (2013.01); *G02F 2001/133317* (2013.01); *G02F 2001/133322* (2013.01); *G02F 2001/133331* (2013.01)

(58) Field of Classification Search
CPC ........ G09F 13/04; G02F 1/13357; H01Q 1/52
USPC ........... 345/173, 178, 84, 158, 522, 102, 156, 345/418, 179, 456.3, 456.1, 207, 690, 204; 349/65, 62, 161, 61, 59, 95; 361/679.01, 679.27, 679.21, 679.22, 361/679.02, 679.05, 679.06, 679.09, 361/679.29, 679.44; 343/702, 700 MS; 455/450, 422.1, 411, 426.1, 410, 434, 455/547, 574; 362/613, 23.18, 84, 230, 362/215, 607, 606, 612, 97.1, 225, 260

See application file for complete search history.

(56) References Cited

U.S. PATENT DOCUMENTS

| | | |
|---|---|---|
| 7,165,875 B2 | 1/2007 | Ohtomo et al. |
| 7,557,888 B2 | 7/2009 | Oohira |
| 7,907,232 B2 | 3/2011 | Enomoto |
| 8,031,290 B2 | 10/2011 | Fu |
| 2005/0285991 A1 | 12/2005 | Yamazaki |
| 2008/0273137 A1 | 11/2008 | Jung et al. |
| 2009/0079894 A1 | 3/2009 | Okuda |

(Continued)

FOREIGN PATENT DOCUMENTS

| | | |
|---|---|---|
| EP | 2448243 | 5/2012 |
| WO | 2009009764 | 1/2009 |

*Primary Examiner* — Hung Duong
(74) *Attorney, Agent, or Firm* — Treyz Law Group, P.C.; G. Victor Treyz; Kendall P. Woodruff

(57) ABSTRACT

An electronic device is provided with a display such as a liquid crystal display mounted in an electronic device housing. The display has display layers such as a layer of liquid crystal material, a color filter layer, a thin-film transistor layer, and polarizer layers. The display also has backlight structures and a display cover layer. Display mounting structures are formed from a metal member that also serves as a structural midplate within the electronic device housing. Plastic reflector structures such as white plastic and plastic trim structures are molded onto the midplate. The plastic reflector structures form a rectangular recess that receives the light guide plate. The midplate has bent wall portions that form a rectangular recess that receives the display layers. The trim structures define a rectangular recess that receives the display cover layer. Protruding portions with openings attach the midplate to the housing.

23 Claims, 16 Drawing Sheets

(56) References Cited

U.S. PATENT DOCUMENTS

| | | |
|---|---|---|
| 2011/0187958 A1 | 8/2011 | Ogatsu |
| 2012/0242926 A1 | 9/2012 | Hsu et al. |
| 2013/0293425 A1* | 11/2013 | Zhu .................. H01Q 1/243 343/702 |
| 2014/0049727 A1* | 2/2014 | Qi et al. ...................... 349/65 |
| 2014/0092034 A1* | 4/2014 | Franklin et al. ............ 345/173 |

* cited by examiner

ELECTRONIC DEVICE WITH UNIFIED DISPLAY MOUNTING STRUCTURES

BACKGROUND

This relates generally to electronic devices and, more particularly, to electronic devices with displays.

Electronic devices often include displays. For example, cellular telephones and portable computers often include displays for presenting information to a user. Displays may include backlight structures, liquid crystal display layers, and a cover glass layer. For structural support, an electronic device may sometimes be provided with an internal sheet metal support member that spans the housing walls in the device.

Incorporating structures such as these within the limited space available in a compact electronic device poses challenges. If care is not taken, a device may have insufficient structural support or may be undesirably bulky.

It would therefore be desirable to be able to provide improved configurations for providing electronic devices with structures such as internal housing support members and displays.

SUMMARY

An electronic device is provided with a display such as a liquid crystal display mounted in an electronic device housing. The display has display layers such as a layer of liquid crystal material, a color filter layer, a thin-film transistor layer, and polarizer layers. The display also has backlight structures and a display cover layer. Display mounting structures are formed from a metal member such as a stainless steel sheet metal structure that serves as a structural midplate within the electronic device housing.

Plastic reflector structures such as white plastic structures are molded onto the midplate in a rectangular ring shape. The plastic reflector structures form a rectangular recess that receives the light guide plate. The reflective structures reflect light that has leaked from the backlight structures back into the backlight structures to improve backlight efficiency. If desired, a reflective coating such as a layer of white paint or a tape layer may be used as reflective structures.

The midplate may have bent wall portions that form a rectangular recess that receives the display layers. The bent wall may have a downwardly extending portion that forms leg structures. The leg structures may be used in attaching the display mounting structures to the housing. If desired, separate leg structures may be welded to the midplate. Openings in the leg structures may be configured to receive a mating engagement feature such as a spring structure that is attached to the housing. Screws or other fasteners may also be used in attaching the leg structures and therefore the midplate and other display mounting structures to the housing.

The trim structures define a rectangular recess that receives the display cover layer. The trim structures may have planar portions at opposing ends of the midplate. Openings such as speaker openings, camera openings, sensor openings, and button openings may be formed in the planar portions of the trim structures. A layer of adhesive may be used to attach the planar portions of trim structures and other portions of the trim structures to the display cover layer.

Further features, their nature and various advantages will be more apparent from the accompanying drawings and the following detailed description of the preferred embodiments.

DETAILED DESCRIPTION

Displays in electronic devices such as liquid crystal displays are mounted in display mounting structures. The display mounting structures include structures that support and surround layers of a backlight unit, liquid crystal display layers, and a display cover layer such as a clear layer of plastic or glass. The display mounting structures span an interior portion of a device housing to contribute structural support to the display housing.

Housing engagement features and trim features are integrated into the display mounting structures. The display mounting structures serve multiple functions in an electronic device such as display layer and backlight layer mounting functions, display cover layer trim and mounting functions, housing engagement functions, and housing support functions, so the display mounting structures may sometimes be referred to as unified display structures or unified display mounting structures.

Figure 1:
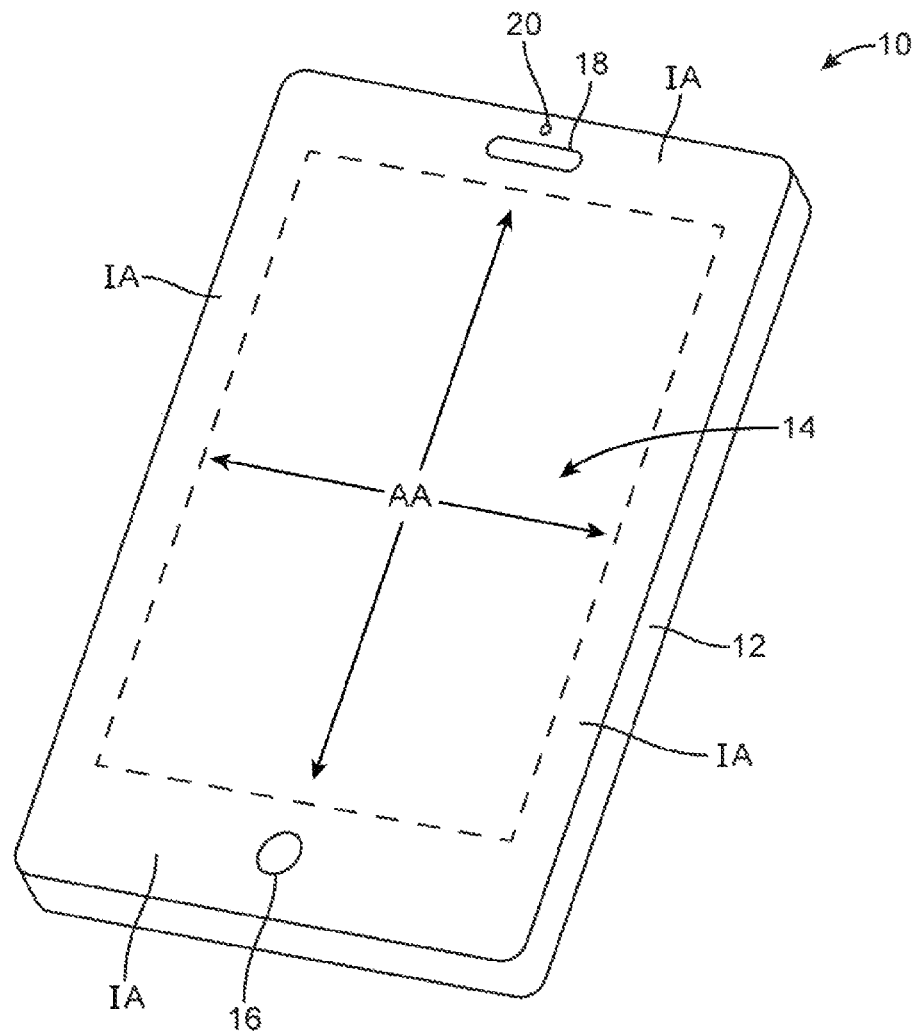
FIG. 1 is a perspective view of an illustrative electronic device such as a handheld electronic device with display and housing structures in accordance with an embodiment.

An illustrative electronic device of the type that may be provided with unified display mounting structures such as these is shown in FIG. 1. In electronic device 10 of FIG. 1, display 14 is mounted on within housing 12. Device 10 may be a handheld device such as a cellular telephone, music player, gaming device, navigation unit, or other compact device or may be other electronic equipment such as a computer monitor, a tablet computer, a portable computer, television equipment, etc. In the example of FIG. 1, housing 12 has opposing front and rear surfaces. Display 14 is mounted on the front face of housing 12. Display 14 has an exterior layer that includes openings for components such as button 16 and speaker port 18. Window structures such as window 20 may be formed for cameras and sensors.

Housing 12 of device 10, which is sometimes referred to as a case, is formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components or other suitable image pixel structures.

A display cover layer may cover the surface of display 14 or a display layer such as a color filter layer or other portion of a display may be used as the outermost (or nearly outermost) layer in display 14. The outermost display layer may be formed from a transparent glass sheet, a clear plastic layer, or other transparent member.

Central rectangular region AA of display 14 forms an active area that includes an array of display pixels. The display pixels produce images for the user of device 10. Display 14 has an inactive border region IA that surrounds active region AA. In inactive border region IA, the underside of the outermost glass or plastic layer of device 10 is provided with a layer of black ink or other opaque masking material. Inactive border region IA is free of display pixels and does not produce images for the user of device 10. If desired, openings such as an opening associated with window 20 of FIG. 1 can be provided in the opaque masking layer to accommodate proximity sensors, ambient light sensors, cameras, and other device that receive or transmit light through the display cover layer of display 14.

Figure 2:
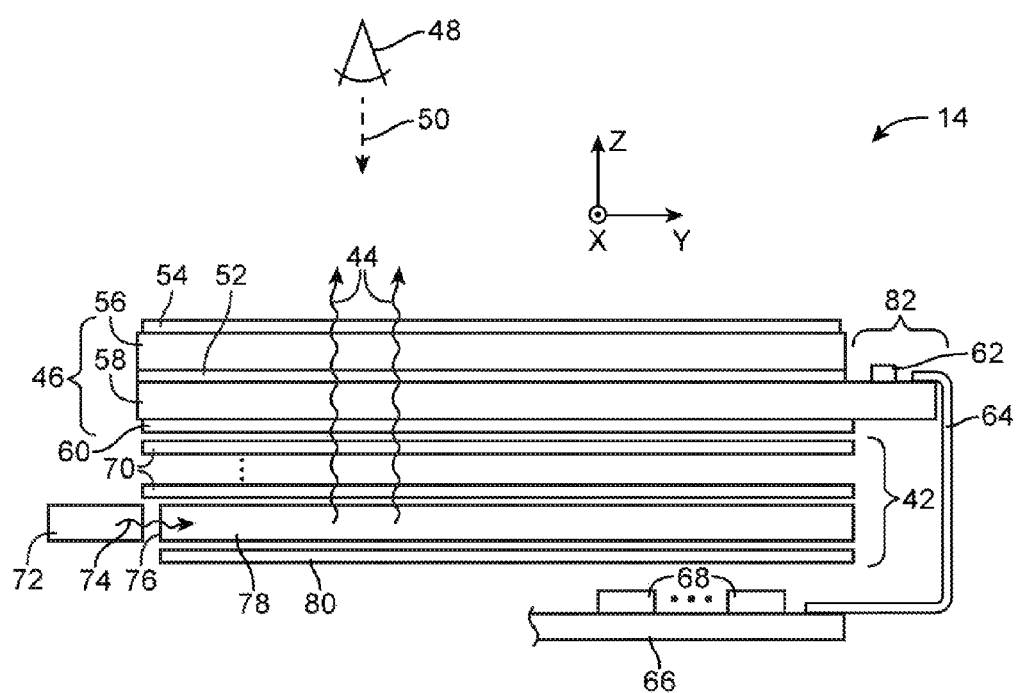
FIG. 2 is a cross-sectional side view of an illustrative display of the type that may be used in the device of FIG. 1 in accordance with an embodiment.

A cross-sectional side view of an illustrative configuration for display 14 of device 10 is shown in FIG. 2. As shown in FIG. 2, display 14 includes backlight structures such as backlight unit 42 for producing backlight 44. During operation, backlight 44 travels outwards (vertically upwards in dimension Z in the orientation of FIG. 2) and passes through display pixel structures in display layers 46. This illuminates any images that are being produced by the display pixels for viewing by a user. For example, backlight 44 illuminates images on display layers 46 that are being viewed by viewer 48 in direction 50.

Display layers 46 form a liquid crystal display or may be used in forming displays of other types. Touch sensor structures such as capacitive touch sensor array structures formed from patterned indium tin oxide electrodes may be integrated into display layers 46 (e.g., to form a touch screen display).

In a configuration in which display layers 46 are used in forming a liquid crystal display, display layers 46 include a liquid crystal layer such a liquid crystal layer 52. Liquid crystal layer 52 is sandwiched between display layers such as display layers 58 and 56. Layers 56 and 58 are interposed between lower polarizer layer 60 and upper polarizer layer 54.

Layers 58 and 56 are formed from transparent substrate layers such as clear layers of glass or plastic. Layers 56 and 58 are layers such as a thin-film transistor layer (e.g., a thin-film-transistor substrate such as a glass layer coated with a layer of thin-film transistor circuitry) and/or a color filter layer (e.g., a color filter layer substrate such as a layer of glass having a layer of color filter elements such as red, blue, and green color filter elements arranged in an array). Conductive traces, color filter elements, transistors, and other circuits and structures are formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 is a thin-film transistor layer that includes an array of thin-film transistors and associated electrodes (display pixel electrodes) for applying electric fields to liquid crystal layer 52 and thereby displaying images on display 14. Layer 56 is a color filter layer that includes an array of color filter elements for providing display 14 with the ability to display color images. If desired, layer 58 may be a color filter layer and layer 56 may be a thin-film transistor layer.

During operation of display 14 in device 10, control circuitry (e.g., one or more integrated circuits such as components 68 on printed circuit 66 of FIG. 2 and/or other circuitry) is used to generate information to be displayed on display 14 (e.g., display data). The information to be displayed is conveyed from circuitry 68 to display driver integrated circuit 62 using a signal path such as a signal path formed from conductive metal traces in flexible printed circuit 64 (as an example).

Display driver circuitry such as display driver integrated circuit 62 of FIG. 2 is mounted on thin-film-transistor layer driver ledge 82 or elsewhere in device 10. A flexible printed circuit cable such as flexible printed circuit 64 is used in routing signals between printed circuit 66 and thin-film-transistor layer 58. If desired, display driver integrated circuit 62 may be mounted on printed circuit 66 or flexible printed circuit 64. Printed circuit 66 is formed from a rigid printed circuit board (e.g., a layer of fiberglass-filled epoxy) or a flexible printed circuit (e.g., a flexible sheet of polyimide or other flexible polymer layer).

Backlight structures 42 include a light guide plate such as light guide plate 78. Light guide plate 78 is formed from a transparent material such as clear glass or plastic. During operation of backlight structures 42, a light source such as light source 72 generates light 74. Light source 72 may be, for example, an array of light-emitting diodes. Light source 72 may be located under driver ledge 82 or, as shown in FIG. 2, may be mounted adjacent to light guide plate 78 on an opposing edge of display 14.

Light 74 from one or more light sources such as light source 72 is coupled into one or more corresponding edge surfaces such as edge surface 76 of light guide plate 78 and is distributed in dimensions X and Y throughout light guide plate 78 due to the principal of total internal reflection. Light guide plate 78 includes light-scattering features such as pits or bumps. The light-scattering features are located on an upper surface and/or on an opposing lower surface of light guide plate 78.

Light 74 that scatters upwards in direction Z from light guide plate 78 serves as backlight 44 for display 14. Light 74 that scatters downwards is reflected back in the upwards direction by reflector 80. Reflector 80 is formed from a reflective material such as a layer of white plastic or other shiny materials.

To enhance backlight performance for backlight structures 42, backlight structures 42 include optical films 70. Optical films 70 include diffuser layer structures for helping to homogenize backlight 44 and thereby reduce hotspots, compensation film structures for enhancing off-axis viewing, and one or more brightness enhancement films (also sometimes referred to as turning films) for collimating backlight 44. Optical films 70 overlap the other structures in backlight unit 42 such as light guide plate 78 and reflector 80. For example, if light guide plate 78 has a rectangular footprint in the X-Y plane of FIG. 2, optical films 70 and reflector 80 preferably have a matching rectangular footprint.

The outermost layer of display 14 may be a protective display layer such as a layer of glass that covers layers 46 or a display layer such as color filter layer 56 (e.g., a glass substrate layer in layer 56) may serve as the outermost structural layer in display 14.

Figure 3:
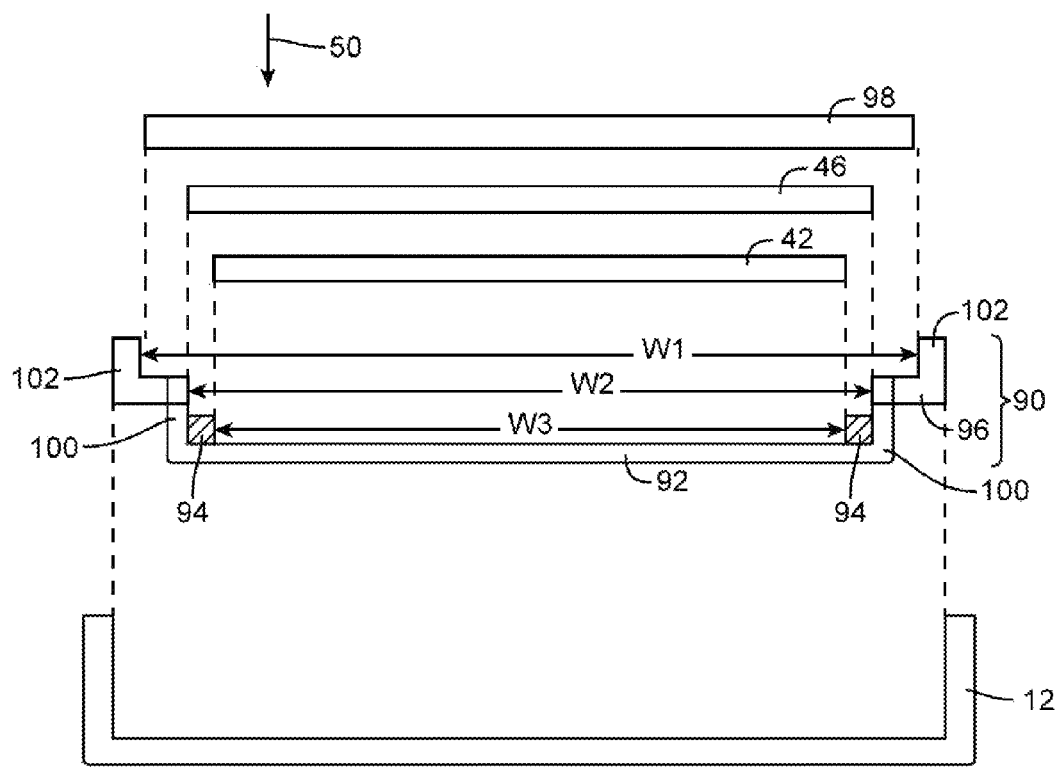
FIG. 3 is a cross-sectional side view of a display mounting structure that is configured to provide structural support in a device housing in accordance with an embodiment.

Display mounting structures such as display mounting structures 90 of FIG. 3 allow display structures to be assembled together to form display 14 of FIG. 1. Display structures 90 in the example of FIG. 3 include a planar member such as plate 92. Plate 92 may be formed from plastic, metal, carbon-fiber composites and other fiber-based composites, or other suitable materials. As an example, plate 92 can be formed from a relatively stiff material such as stainless steel sheet metal. The thickness of plate 92 may be less than 0.5 mm, less than 0.2 mm, or other suitable thickness. Plate 92 may be mounted in the middle of device housing 12, so plate 92 may sometimes be referred to as a midplate or metal midplate structure. The presence of midplate 92 within device housing 12 may help prevent housing 12 from twisting during operation by a user.

Midplate 92 has a rectangular shape when viewed in direction 50. Edges 100 of plate 92 may, if desired, be bent. In the example of FIG. 3, edges 100 have been bent vertically to form vertical sidewall portions.

Plastic or other materials may be attached to midplate 92. For example, plastic structures 94 may be injection molded onto midplate 92 in a rectangular ring shape following the rectangular interior surface of sidewalls 100. Plastic structures 94 can be formed from a reflective material such as white plastic to serve as light reflectors that help redirect light leaking from the edges of a light guide plate in backlight structures 42 (e.g., light guide plate 78 of FIG. 2) back into the light guide plate, thereby improving backlight efficiency.

Trim structures such as plastic trim structures 102 can also be injection molded onto midplate 92. For example, midplate 92 may have a rectangular shape with a peripheral edge that is surrounded by trim structures 102. Trim structures 102 may run along the peripheral edge so as to create a rectangular recess into which a rectangular display cover layer may be received.

Plastic structures such as structures 94 and 102 may, in general, be formed from any suitable polymeric materials. Structures 94 and 102 may, for example, be formed from thermoplastic materials such as polycarbonate or other plastics that can be molded using injection molding equipment (e.g., to perform insert molding operations). If desired, some or all of structures 94 and 102 may be formed from thermoset materials such as epoxy. Configurations in which structures 94 and 102 are formed from thermoplastics are sometimes described herein as an example.

Trim structures 102, midplate walls 100, and reflective structures 94 form integral parts of unified display mounting structure 90 and are configured to form rectangular recesses that receive display structures such as backlight unit 42, display layers 46, and display cover layer 98. For example, the lateral spacing W3 between opposing reflective structures 94 on either side of device 10 is configured to receive backlight structures 42 (i.e., the opening formed between reflective structures 94 is sized appropriately to serve as a rectangular receptacle into which rectangular backlight structures 42 are mounted). The lateral spacing W2 between the upper inner edge portions of walls 100 (i.e., the portions of walls 100 that are not covered by reflective plastic structures 94) is configured to receive display layers 46 (i.e., the opening formed between the uncoated upper portions of walls 100 is sized appropriately to serve as a rectangular receptacle into which rectangular display layers 46 are mounted). Trim structures 102 of FIG. 3 are likewise configured to form vertical walls surrounding a rectangular opening that serves as a receptacle into which display cover layer 98 is mounted. The unified nature of display mounting structures 90 allows device size to be minimized while retaining sufficient structural support for housing 12.

Figure 4:
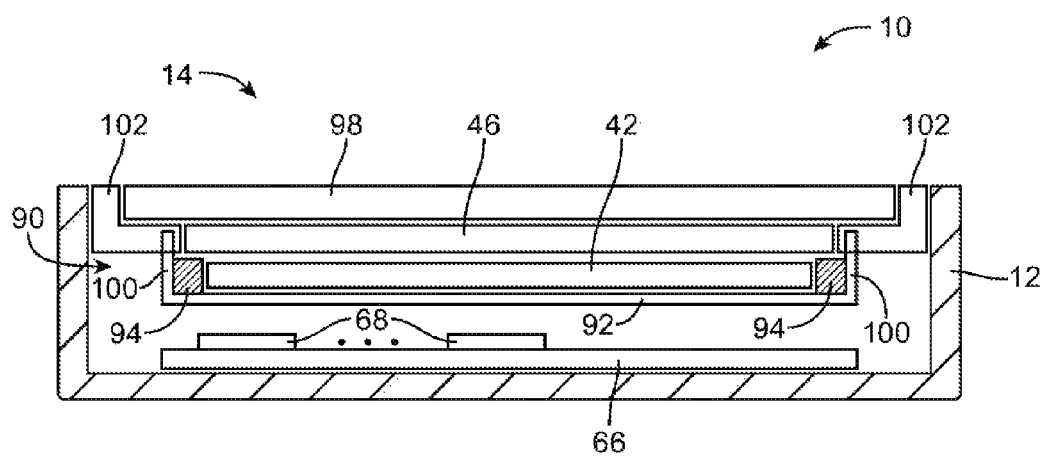
FIG. 4 is a cross-sectional side view of an electronic device containing display mounting structures for mounting display components and providing structural support in a housing in accordance with an embodiment.

FIG. 4 is a cross-sectional side view of device 10 in a configuration in which display 14 has been assembled by mounting display cover layer 98 within the opening formed between trim structures 102, by mounting display layers 46 within the opening formed between opposing portions of uncovered walls 100 of midplate member 92, and by mounting backlight structures 42 within the opening formed between opposing reflective structures 94. FIG. 4 also shows how housing 12 may surround and enclose trim structures 102 (as an example). Components 68 are mounted on one or more substrates such as substrate 66 within housing 12. Midplate 92 adds structural support to housing 12, so that housing 12 resists twisting during use. Unified display mounting structures 90 provide structural support using midplate 92 while providing recesses that allow the components of display 14 to be mounted in device 10.

Figure 5:
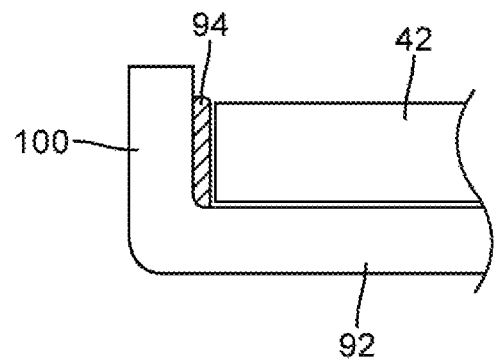
FIG. 5 is a cross-sectional side view of display mounting structures having an inner peripheral edge that has been covered with a reflective coating in accordance with an embodiment of the present invention.
Figure 6:
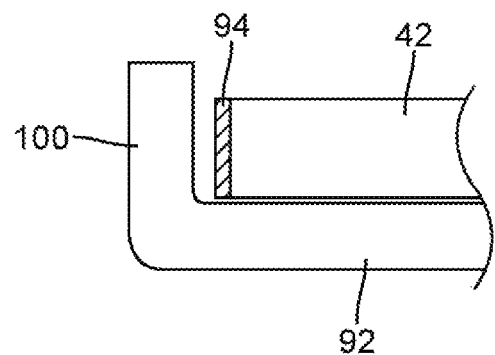
FIG. 6 is a cross-sectional side view of display mounting structures in which a light guide plate has been mounted that has a peripheral edge coated with a reflective coating layer in accordance with an embodiment.

If desired, reflective structures 94 may be implemented using a thin reflective layer on the interior surface of wall 100 of midplate 92, as illustrated by reflective layer 94 of FIG. 5. Layer 94 of FIG. 5 may be formed from a coating of white paint, white tape that has a layer of pressure sensitive adhesive for attaching the tape to wall 100 of midplate 92, or other thin reflective material. During operation, light from light guide plate 78 in backlight structures 42 that escapes from the edge of light guide plate 78 will be reflected back into light guide plate 78 by coating 94 to enhance backlight efficiency. In the example of FIG. 6, reflective material 94 has been formed on the peripheral edge of backlight structures 42 (e.g., on the edges of light guide plate 78 other than the edge into which light 74 is being launched). Reflective material 94 of FIG. 6 may be white paint, metal, plastic or other reflective coatings.

Figure 7:
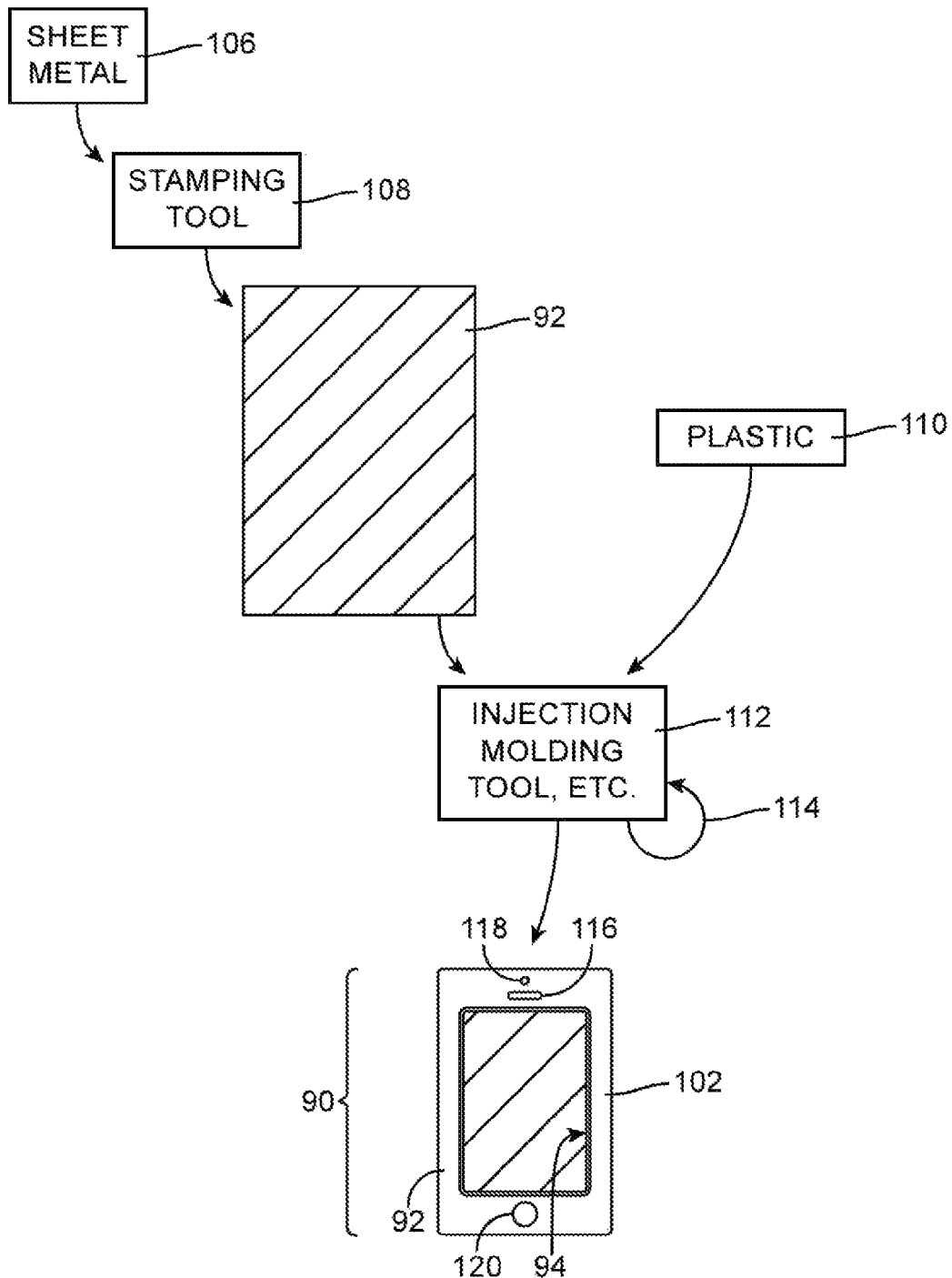
FIG. 7 is a system diagram showing how display mounting structures that are configured to provide an electronic device with structural support may be constructed in accordance with an embodiment of the present invention.

FIG. 7 is a system diagram showing how display mounting structures 90 may be formed. In the example of FIG. 7, display mounting structures 90 are being formed from a metal sheet and integrally formed injection-molded plastic structures. Other approaches for forming display mounting structures 90 may be used if desired (e.g., by forming structures 90 from different materials, by forming coatings or attaching tape layers as described in connection with FIGS. 5 and 6, etc.). The configuration of FIG. 7 is merely illustrative.

As shown in FIG. 7, sheet metal 106 is stamped into a desired shape using stamping tool 108 or other manufacturing equipment. Sheet metal 106 may, for example, be formed using laser cutting, machining, bending, etc.

After forming midplate member 92 from sheet metal 106 using tool 108, injection-molded plastic structures such as reflective structures 94 and trim structures 102 are formed. As shown in FIG. 7, plastic 110 for forming structures 94 and 102 is received by injection molding tool 112 or other equipment for forming plastic parts. Tool 112 may form structures 94 and/or structures 102 as integrally molded parts on midplate 92. One or more shots of plastic 110 may be used in creating structures 94 and 102, as illustrated schematically by line 114. For example, tool 112 may form structures 94 from a shot of white plastic and may form structures 102 from a shot of black plastic (as an example). Midplate 92 may be provided with holes or other engagement features to help ensure a satisfactory bond between the injection molded plastic and metal midplate 92.

Following injection molding operations with injection molding tool 112, display mounting structures 90 include reflective structures 94 and trim structures 102. During injection molding operations, openings may be formed in the plastic structures. As shown in FIG. 7, openings that may be formed in the injection molded plastic of structures 90 include openings such as speaker opening 116 in trim structures 102 to form speaker port 18 of FIG. 1, button opening 120 in trim structures 102 to accommodate buttons such as button 16 of FIG. 1, and one or more additional openings such as opening 118 (e.g., to accommodate proximity sensors, ambient light sensors, camera sensors, or other components associated with a window such as window 20 of FIG. 1).

Figure 8:
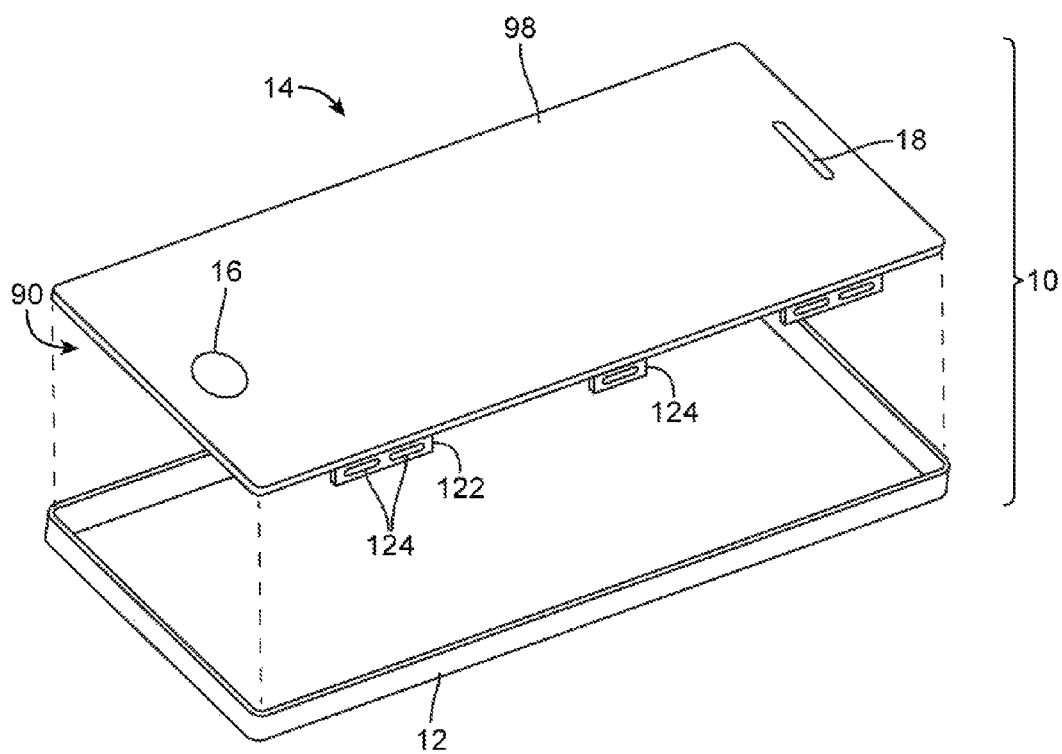
FIG. 8 is a perspective view of an illustrative display mounted under a display cover layer using display mounting structures having legs that engage with features on a mating device housing in accordance with an embodiment.

FIG. 8 is an exploded perspective view of device 10 in a configuration in which display mounting structures 90 have been used to form display 14. As shown in FIG. 8, display mounting structures 90 may be provided with downwardly protruding structures such as legs 122. Legs 122 may have openings 124. Legs 122 may be formed as an integral portion of midplate member 92 or may be attached to midplate member 92 using welds (e.g., in scenarios in which legs 122 are formed from metal). Legs 122 may be used in attaching display 14 to housing 12.

Figure 9:
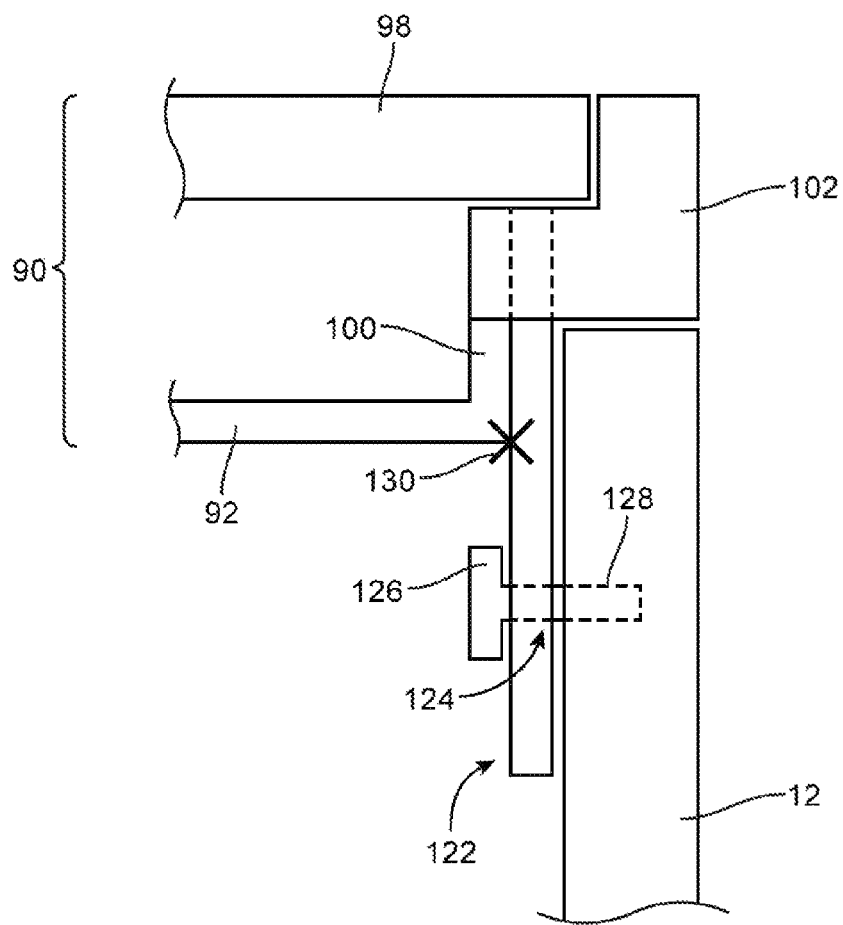
FIG. 9 is a cross-sectional side view of a portion of a display mounting structure that has a leg structure attached to an electronic device housing wall using a fastener such as a screw in accordance with an embodiment.
Figure 10:
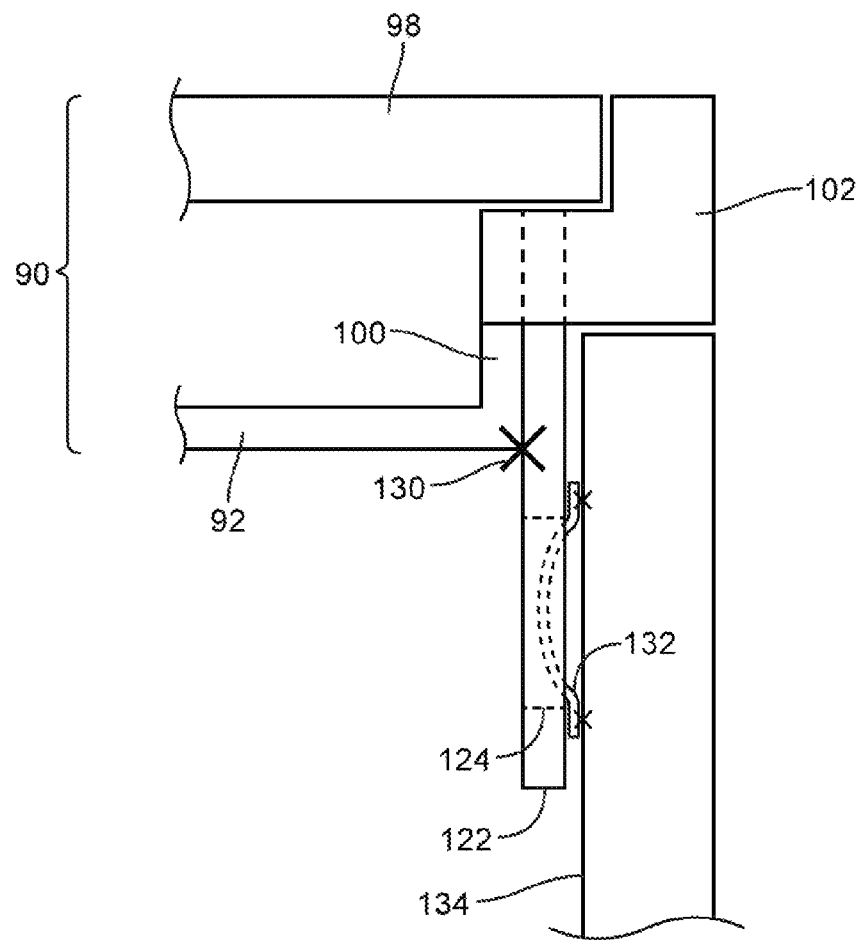
FIG. 10 is a cross-sectional side view of a portion of a display mounting structure that has a leg structure attached to an electronic device housing wall using a mating engagement feature such as a spring that engages an opening in the leg structure in accordance with an embodiment.

FIGS. 9 and 10 are cross-sectional side views of device 10 taken through a portion of the right edge of device 10 of FIG. 1.

In the configuration of FIG. 9, a fastener such as screw 126 has a shaft such as shaft 128 that passes through opening 124 and screws into a threaded hole in housing 12. This allows legs 122 to be used in attaching display mounting structures 90 to housing 12. Welds such as weld 130 are used in attaching legs 122 such as metal legs to midplate 92.

In the configuration of FIG. 10, spring 132 has been welded to inner surface 134 of housing wall 12. Spring 132 forms an engagement feature on housing wall 12 that protrudes into opening 124 and thereby attaches leg 122 and display mounting structures 90 to housing 12.

Figure 11:
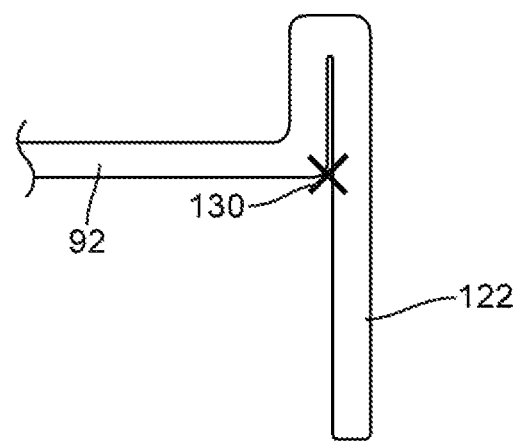
FIG. 11 is a cross-sectional side view of a portion of a display mounting structure that has a leg structure that has been formed from an integral bent portion of a sheet metal display mounting plate in accordance with an embodiment.

As shown in FIG. 11, legs 122 may be formed as integral portions of midplate 92. In particular, portions of midplate 92 may be bent to form each downwardly protruding leg structure 122. Optional welds 130 provide additional structural support.

Figure 12:
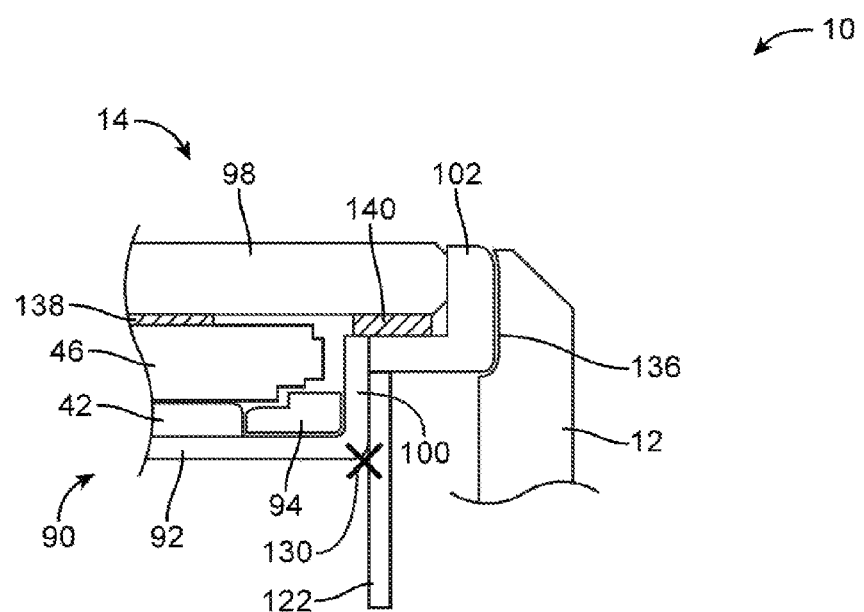
FIG. 12 is a cross-sectional side view of a portion of a display mounting structure having an insert-molded trim structure that mates with a portion of a housing wall in accordance with an embodiment of the present invention.

FIG. 12 is a cross-sectional side view of a portion of device 10 along the right edge of display 14 showing how housing 12 may have a feature such as trim support feature 136 for receiving and supporting trim structures 102. Trim support feature 136 of FIG. 12 is formed from a curved inner surface on housing wall 12 that is configured to mate with the outer shape of trim structures 102. Other trim support configurations may be used, if desired. Adhesive 140 is used to attach display cover layer 98 to trim structures 102 and midplate wall 100 of display mounting structures 100. Adhesive 138 attaches display cover layer 98 to display layers 46.

Figure 13:
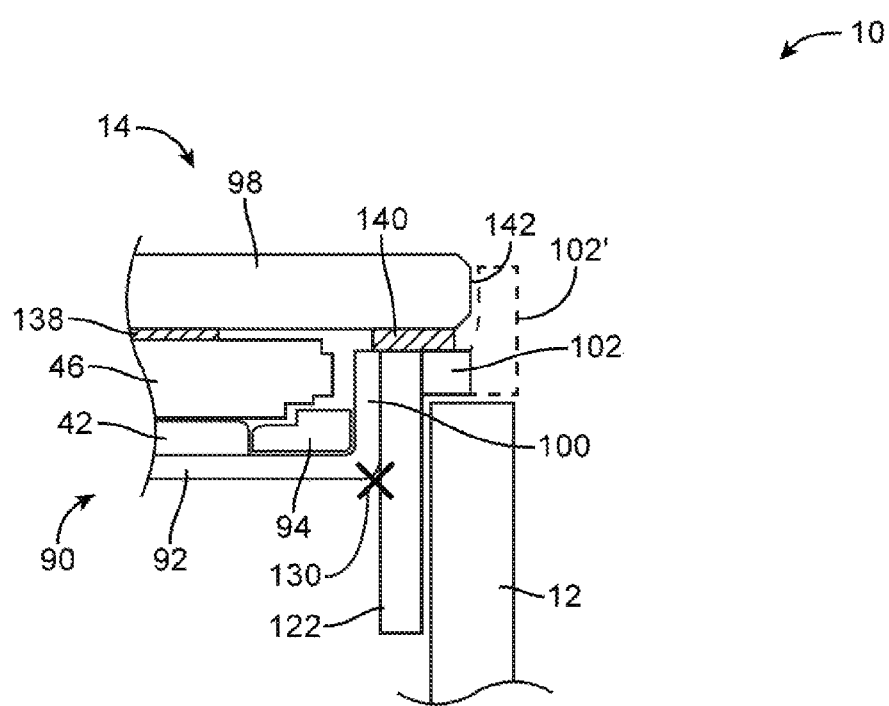
FIG. 13 is a cross-sectional side view of a corner portion of a display mounting structure attached to an electronic device housing wall so that an integral trim portion of the display mounting structure lies above the upper edge of the housing wall in accordance with an embodiment.

In the illustrative configuration of FIG. 13, trim structures 102 are formed on top of the upper edge of housing wall 12. If desired, side portion 102' of trim structures 102 may be used to cover peripheral edge 142 of display cover layer 98. Portion 102' of trim structures 102 may be omitted so that edge 142 is left uncovered.

Figure 14:
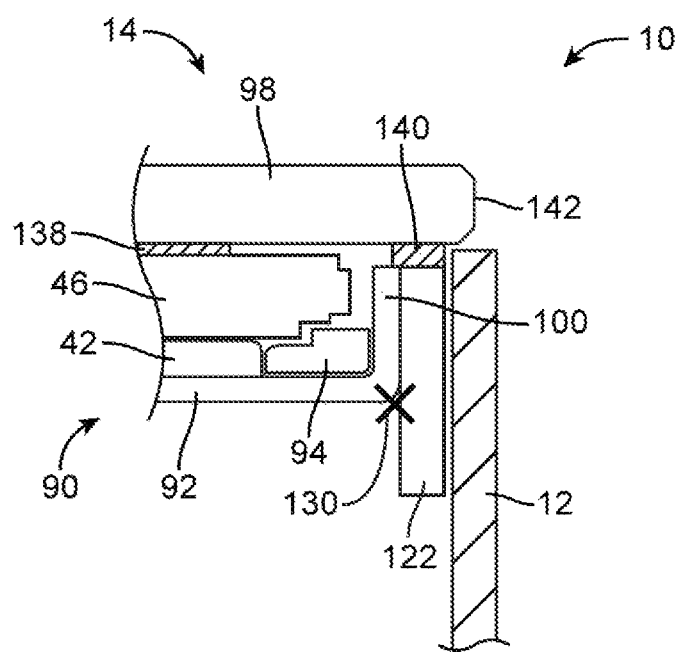
FIG. 14 is a cross-sectional side view of a corner portion of a display mounting structure attached to an electronic device housing wall so that a display cover layer that is uncovered by trim structures is mounted above the upper edge of the housing wall in accordance with an embodiment.

FIG. 14 is a cross-sectional view of a side portion of device 10 in an illustrative configuration in which trim structures 102 have been omitted from display mounting structures 90. Peripheral edge 142 of display cover layer 98 has been left exposed and uncovered by trim structures 102. In the configuration of FIG. 14, housing 12 is located below the lower surface of display cover layer 98.

Figure 15:
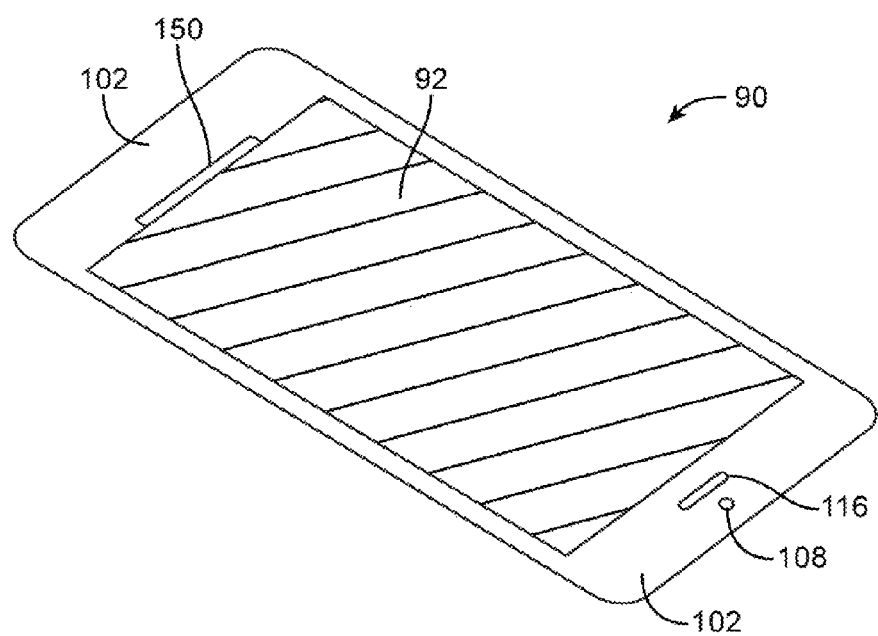
FIG. 15 is a perspective view of a portion of a display mounting structure formed from a planar sheet metal structure and plastic structures such as injection molded plastic in accordance with an embodiment.

As shown in the perspective view of FIG. 15, display mounting structures 90 may be configured to create one or more openings such as opening 150. Opening 150 in the illustrative configuration of FIG. 15 has been formed in the shape of a thin slot between trim structures 102 and midplate 92. The slot-shaped opening may be used to accommodate a structure such as a flexible printed circuit.

Figure 16:
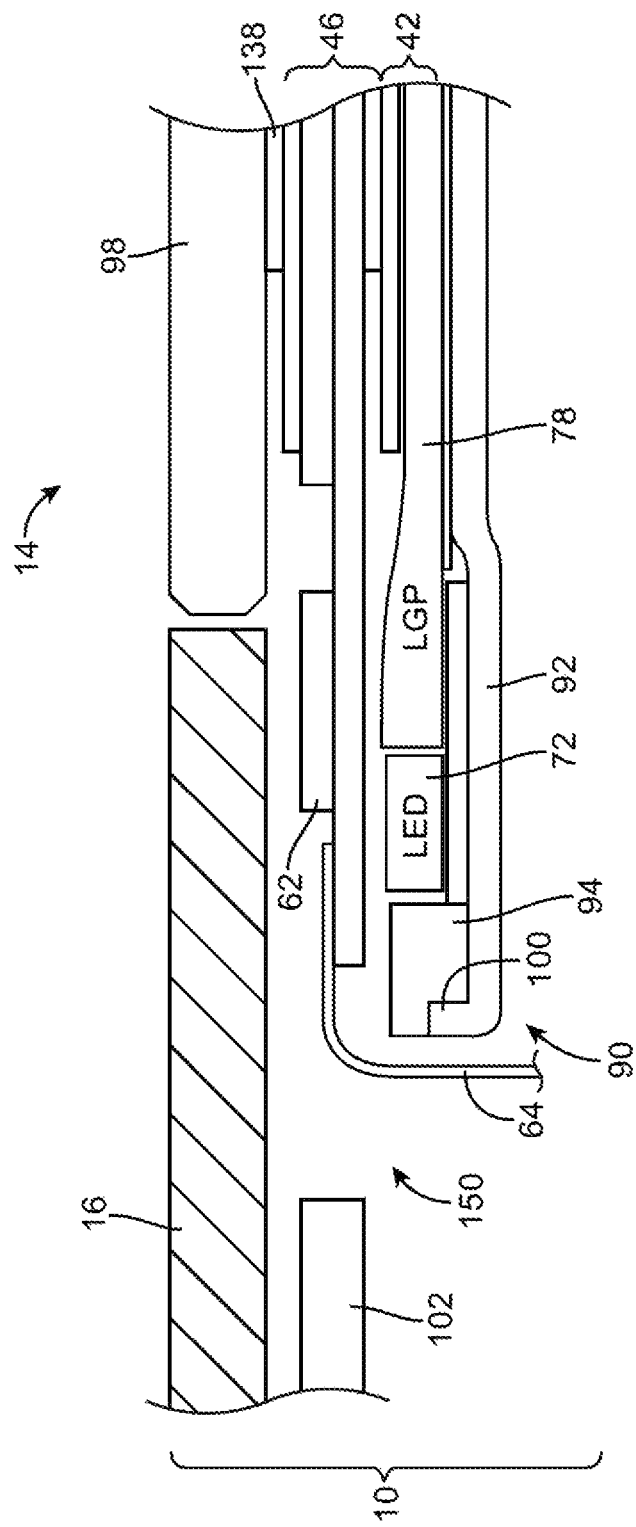
FIG. 16 is a cross-sectional side view of a portion of an electronic device showing how display structures may be mounted within the device using display mounting structures formed from a sheet metal member and injection molded plastic structures in accordance with an embodiment.

A cross-sectional side view of device 10 taken through button 16 of FIG. 1 in a configuration in which device 10 has a slot-shaped opening such as opening 150 of FIG. 15 is shown in FIG. 16. As shown in FIG. 16, button 16 may reside above opening 150 and planar portions of trim structures 102. Flexible printed circuit 64 (see, e.g., FIG. 2) passes through opening 150 to link components 68 on substrate 66 (FIG. 2) with driver integrated circuit 62 and other circuitry in display layers 46.

Figure 17:
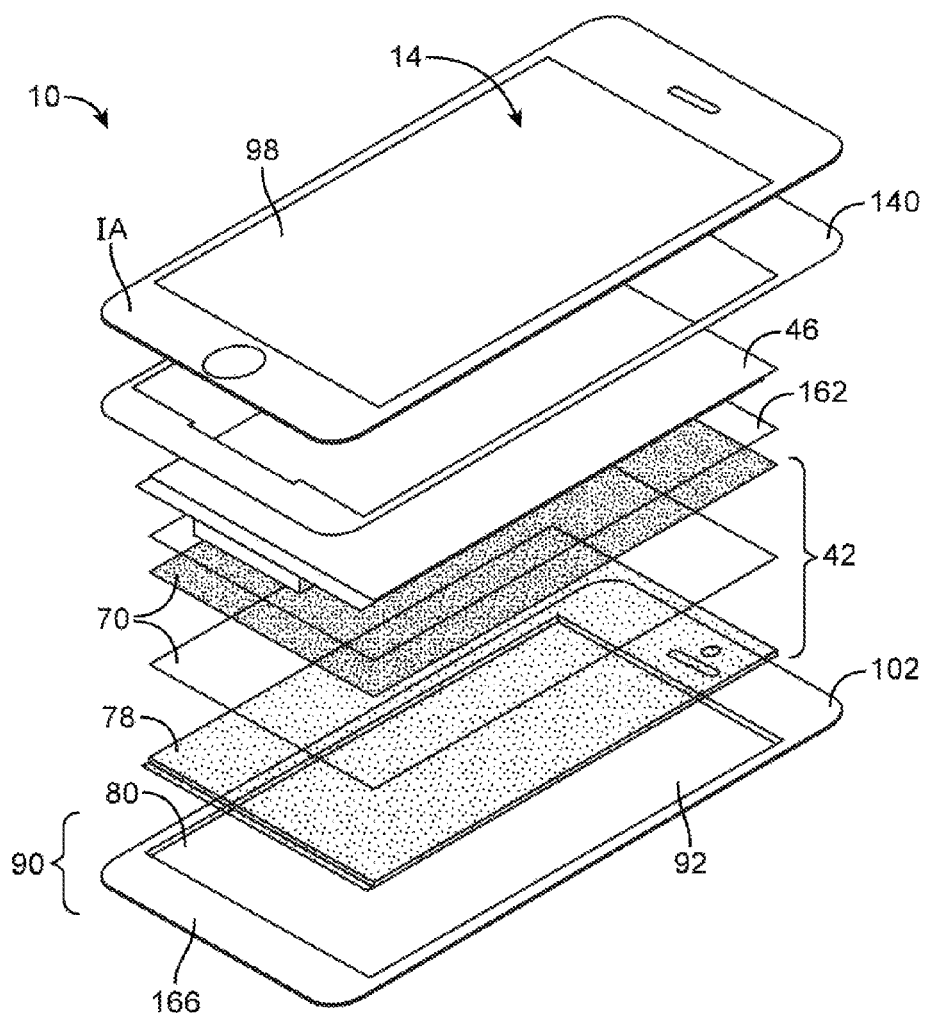
FIG. 17 is a perspective view of illustrative display structures and display mounting structures in accordance with an embodiment.

FIG. 17 is a perspective view of illustrative layers of structures for forming display 14 in device 10. Display mounting structures 90 have recesses for receiving display components such as reflector 80 and other backlight structures 42, display layers 46, and display cover layer 98. Adhesive 140 is preferably interposed between the lower surface of display cover layer 98 (e.g., in inactive regions IA) and corresponding upper planar surfaces 166 of the planar portions at the opposing first and second ends of trim structures 102 (i.e., the top of the extended rectangular planar portions of structures 102 that are molded onto the first and second opposing ends of midplate 92). Using adhesive 140, display cover layer 98 is attached to display mounting structures 90. A ring of tape such as tape ring 162 serves as a vertical spacer that prevents layers 70 in backlight structures 42 from contacting the lower portions of display layers 46.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    a housing;
    a planar metal midplate member mounted to the housing that stiffens the housing;
    reflector structures on the planar midplate member that form a recess; and
    display backlight structures in the recess formed from the reflector structures.

2. The electronic device defined in claim 1 wherein the reflector structures comprise injection molded plastic structures that are injection molded onto the planar metal midplate member.

3. The electronic device defined in claim 1 wherein the planar metal midplate member has walls that form a recess and wherein the electronic device further comprises display layers mounted in the recess formed by the walls of the planar metal midplate member.

4. The electronic device defined in claim 3 further comprising plastic trim structures that are injection molded onto the planar midplate member.

5. The electronic device defined in claim 4 wherein the plastic trim structures form a recess and wherein the electronic device further comprises a display cover layer that is received within the recess formed by the plastic trim structures.

6. The electronic device defined in claim 5 wherein the plastic trim structures include at least one opening.

7. The electronic device defined in claim 6 wherein the opening has a slot shape and is formed along an edge of the planar metal midplate member to accommodate a flexible printed circuit.

8. The electronic device defined in claim 6 wherein the opening comprises a circular camera window opening.

9. The electronic device defined in claim 5 wherein the housing has portions that are configured to support an outer edge surface of the trim structures.

10. The electronic device defined in claim 5 wherein the display cover layer has a speaker port opening and wherein the plastic trim structures include a speaker port opening that is aligned with the speaker port opening in the display cover layer.

11. The electronic device defined in claim 5 further comprising a layer of adhesive that attaches the display cover layer to the plastic trim structures.

12. The electronic device defined in claim 5 further comprising leg structures that attach the planar metal midplate member to the housing.

13. The electronic device defined in claim 12 wherein the leg structures comprise protruding bent portions of the planar midplate member with holes.

14. The electronic device defined in claim 12 wherein the leg structures comprise metal members with holes that are welded to the planar midplate member.

15. Display mounting structures into which a display cover layer for an electronic device is assembled, comprising:
    a sheet metal plate having a rectangular periphery; and
    injection molded plastic trim structures that are injection molded on the sheet metal plate and that surround the periphery to create a rectangular recess that receives the display cover layer.

16. The display mounting structures defined in claim 15 wherein the sheet metal plate has wall portions that surround a rectangular recess that is configured to receive a display backlight light guide plate with edges, the electronic device display mounting structures further comprising reflective structures around the rectangular recess that are configured to reflect light leaking from the display backlight light guide plate back into the edges.

17. The display mounting structures defined in claim 16 wherein the reflective structures comprise injection molded white plastic that is injection molded onto the sheet metal plate.

18. The display mounting structures defined in claim 16 wherein the reflective structures comprise white paint on the sheet metal plate.

19. The display mounting structures defined in claim 16 wherein the reflective structures comprise white tape that is attached to the sheet metal plate with adhesive.

20. The display mounting structures defined in claim 15 wherein the electronic device has a housing and wherein the sheet metal plate forms a structural midplate member configured to attach to the housing to prevent the housing from twisting.

21. Display mounting structures into which a display cover layer, liquid crystal display layers, and backlight structures including a light guide plate are assembled, the display mounting structures comprising:
    a rectangular sheet metal plate;
    plastic reflector structures molded onto the rectangular sheet metal plate; and
    plastic trim structures molded onto the rectangular sheet metal plate, wherein the plastic reflector structures form a first rectangular recess into which the light guide plate is mounted, wherein the rectangular sheet metal plate has wall portions that define a second rectangular recess into which the liquid crystal display layers are mounted, and wherein the plastic trim structures form a third rectangular recess into which the display cover layer is mounted.

22. The electronic device defined in claim 21 wherein the plastic trim structures include planar portions at first and second opposing ends of the rectangular sheet metal plate and wherein the planar portion at the first end has a speaker opening and a camera opening.

23. The electronic device defined in claim 22 wherein the planar portion at the second end has an opening.

* * * * *